(12) United States Patent
Umeno (10) Patent No.: US 7,629,054 B2
(45) Date of Patent: Dec. 8, 2009

(54) SINGLE CRYSTAL SILICON WAFER FOR INSULATED GATE BIPOLAR TRANSISTORS

(75) Inventor: Shigeru Umeno, Tokyo (JP)

(73) Assignee: Sumco Corporation, Tokyo (JP)

( * ) Notice: Subject to any disclaimer, the term of this patent is extended or adjusted under 35 U.S.C. 154(b) by 83 days.

(21) Appl. No.: 11/654,947

(22) Filed: Jan. 17, 2007

(65) Prior Publication Data
US 2007/0186845 A1 Aug. 16, 2007

(30) Foreign Application Priority Data
Jan. 19, 2006 (JP) ............................. 2006-010756

(51) Int. Cl.
*B32B 9/04* (2006.01)
(52) U.S. Cl. .................. 428/446; 428/64.1; 117/932
(58) Field of Classification Search .................. None
See application file for complete search history.

(56) References Cited

U.S. PATENT DOCUMENTS

| 5,178,720 | A | 1/1993 | Frederick |
| 5,904,767 | A | 5/1999 | Liao |
| 6,228,164 | B1 | 5/2001 | Ammon et al. |
| 2004/0192015 | A1 | 9/2004 | Ammon et al. |

FOREIGN PATENT DOCUMENTS

| EP | 0170856 | 2/1986 |
| EP | 1732114 | 12/2006 |
| JP | 61-36197 | 2/1986 |
| JP | 05-043384 | 2/1993 |
| JP | 08-261831 | 10/1996 |
| JP | 2000-7486 | 1/2000 |
| JP | 2001-146496 | 5/2001 |
| JP | 2002-029891 | 1/2002 |
| JP | 2002-128591 | 5/2002 |

OTHER PUBLICATIONS

C.M. Osburn and D.W. Ormond, *Dielectric Breakdown in Silicon Dioxide Films on Silicon*, Journal of Electrochemical Society, May 1972, pp. 591-597.

Transmittal Letter (date-of-receipt Jul. 3, 2007), and Communication and Supplementary European Search Report issued Jun. 25, 2007 in connection with European Patent Application No. 07000774.5.

Takasu, S. et al. *Neutron Transmuted Magnetic Czochralski Grown Silicon Wafer for Power Device*, PESC '88 Record, 19th Annual IEEE Power Electronics Specialists Conference (Cat. No. 88CH2523-9), IEEE New York, New York, USA, Apr. 1988, pp. 1339-1345.

*Primary Examiner*—Timothy M Speer
(74) *Attorney, Agent, or Firm*—Kolisch Hartwell, PC (57) ABSTRACT

A single crystal silicon wafer for use in the production of insulated gate bipolar transistors is made of single crystal silicon grown by the Czochralski method and has a gate oxide with a film thickness of from 50 to 150 nm. The wafer has an interstitial oxygen concentration of at most $7.0 \times 10^{17}$ atoms/cm$^3$, a resistivity variation within the plane of the wafer of at most 5% and, letting $t_{ox}$ (cm) be the gate oxide film thickness and S (cm$^2$) be the electrode surface area when determining the TZDB pass ratio, a density d (cm$^{-3}$) of crystal originated particles (COP) having a size at least twice the gate oxide film thickness which satisfies the formula $d \leq -\ln(0.9)/(S \cdot t_{ox}/2)$. The wafers have an increased production yield and a small resistivity variation.

5 Claims, 4 Drawing Sheets

SINGLE CRYSTAL SILICON WAFER FOR INSULATED GATE BIPOLAR TRANSISTORS

BACKGROUND OF THE INVENTION

1. Field of the Invention

The present invention relates to single crystal silicon wafers for use in the manufacture of insulated gate bipolar transistors, and to a method of manufacturing such single crystal silicon wafers.

Priority is claimed on Japanese Patent Application No. 2006-010756, filed Jan. 19, 2006, the content of which is incorporated herein by reference.

2. Background Art

The insulated gate bipolar transistor (IGBT) is a gate voltage driven switching device suitable for high-power control that is employed, for example, as an inverter in hybrid cars, air conditioning equipment and refrigerators. IGBTs are provided with three electrodes—an emitter, a collector and a gate. A voltage applied to the gate, which has been formed on the top side of the device over an insulating oxide film, controls the current between the emitter on the top side of the device and the collector on the back side.

Because the IGBT is a device that uses a gate insulated with an oxide film to control current, the gate oxide integrity (GOI) is important. If the single crystal silicon wafer contains defects, those defects are taken up into the gate oxide and become a cause of gate oxide breakdown.

IGBTs are not devices which, in the manner of LSI devices such as memory chips, use only the near-surface portion of the wafer in the lateral direction. Rather, being devices which use the wafer in the vertical direction, their characteristics are influenced by the bulk qualities of the wafer. The recombination lifetime and resistivity are particularly important qualities. Given that the recombination lifetime decreases with crystal defects in the substrate, control that keeps crystal defects from arising even when the wafer passes through device forming processes is essential. With regard to resistivity, the qualities desired are uniformity and stability. It is important that the resistivity be uniform not only in the plane of the wafer, but also between wafers, that is, in the length direction of the silicon ingot, and that it remain unchanged even on passing through thermal device processes.

Epitaxial wafers (abbreviated below as "epiwafer") are used as so-called punch through (PT) type IGBT substrates in which a depletion layer comes into contact with the collector side when the current is off. However, a problem with PT-type IGBTs is their high cost on account of the use of an epiwafer. In addition, due to lifetime control, the switching loss at high temperatures increases. As a result, the on voltage at high temperatures decreases and the current concentrates at specific circuit components during parallel use, which sometimes causes failure.

To resolve the defects of PT-type substrates, non-punch through (NPT) type IGBTs have been developed in which the depletion layer does not come into contact with the collector side when the current is off. Furthermore, recently, so-called field stop (FS) IGBTs are being produced which have a trench gate construction and in which a field stop layer is formed on the collector side. Such FS-IGBTs have a lower ON voltage and little switching loss. Wafers with a diameter of 150 mm or less that have been cut from a silicon single crystal grown by the float zone (FZ) method (referred to below as "FZ wafers") have hitherto been used as the substrates for NPT and FS-type IGBTs.

Although FZ wafers are less expensive than epiwafers, to further lower the production costs of IGBTs, it is necessary to create larger diameter wafers. However, it is exceedingly difficult to grow single crystals with a diameter of more than 150 mm by the FZ method, and even were such production to be carried out, the stable supply of such single crystals at a low cost would be very difficult to achieve.

We thus attempted to produce single crystal silicon wafers for IGBTs by the Czochralski (CZ) process, which is capable of easily growing large-diameter crystals.

The art disclosed in JP-A 2001-146496, JP-A 2000-7486 and JP-A 2002-29891 described below is all aimed at reducing defects within the wafer. JP-A 2001-146496 discloses a single crystal silicon wafer which has been grown by the CZ method and is either nitrogen doped, composed throughout of N-regions and has an interstitial oxygen concentration of 8 ppm or less, or is nitrogen doped, eliminates throughout at least point defects and dislocation clusters and has an interstitial oxygen concentration of 8 ppm or less.

JP-A 2000-7486 discloses a method for producing a silicon single crystal that is pulled by the Czochralski method while being doped with oxygen and nitrogen. During the pulling operation, the silicon single crystal is doped with oxygen at a concentration below $6.5 \times 10^{17}$ atoms/cm$^3$ and with nitrogen at a concentration above $5 \times 10^{13}$ atoms/cm$^3$.

JP-A 2002-29891 discloses a silicon semiconductor substrate which is grown by the Czochralski method from a melt to which nitrogen has been added; which has a nitrogen concentration of at least $2 \times 10^{14}$ atoms/cm$^3$ but not more than $2 \times 10^{16}$ atoms/cm$^3$ and an oxygen concentration of not more than $7 \times 10^{17}$ atoms/cm$^3$; which has the various following surface defect densities: flow pattern defects (FPD)$\leq$0.1 defect/cm$^2$, Secco etch pit defects (SEPD)$\leq$0.1 defect/cm$^2$ and oxygen-induced stacking faults (OSF)$\leq$0.1 defect/cm$^2$; which has the following internal defect density: defects detected by IR light scattering tomography (LSTD)$\leq$1$\times$10$^5$ defects/cm$^3$; and which has the following gate oxide integrity characteristics: a time-zero dielectric breakdown (TZDB) high C-mode pass rate of $\geq$90%, and a time-dependent dielectric breakdown (TDDB) pass rate of $\geq$90%.

SUMMARY OF THE INVENTION

Although the above-cited prior art publications disclose methods for producing crystal defect-free wafers, no mention is made of the wafer characteristics required for IGBTs. Moreover, growing a crystal made of defect-free CZ silicon having an interstitial oxygen concentration of $7 \times 10^{17}$ atoms/cm$^3$ or less and a resistivity variation in the plane of the wafer of 5% or less would require large changes in the rotational speeds of the quartz crucible and the crystal from prior-art conditions, reducing the pull rate margin within which a defect-free crystal can be grown and lowering the production yield.

It is therefore an object of the present invention to provide methods of manufacturing single crystal silicon wafers for IGBTs that increase the yield and are capable of producing wafers having a small resistivity variation. Another object of the invention is to provide single crystal silicon wafers for the production of IGBTs.

When single crystal silicon wafers are manufactured by the Czochralski (CZ) method, large-diameter wafers having a diameter of about 300 mm can be produced. However, wafers produced by the CZ method are unsuitable as IGBT wafers for the following reasons.

(1) In the CZ method, surplus vacancies agglomerate during single crystal growth, forming crystal originated particles (COP) about 0.2 to 0.3 µm in size. When IGBTs are produced, a gate oxide film is formed at or near the surface of the wafer. However, if pits created by the emergence of COPs onto the wafer surface or COPs present near the wafer surface become incorporated into this gate oxide film, the gate oxide integrity will worsen. Hence, to avoid a deterioration in the GOI, the density of COPs that become GOI defects must be controlled.

(2) Single crystal silicon wafers produced by the CZ method contain an oxygen excess of about $1 \times 10^{18}$ atoms/cm$^3$. When such wafers are heat treated at 450° C. for about 1 hour (which heat treatment corresponds to sintering treatment in the IGBT manufacturing process), oxygen donors (thermal donors) are generated, lowering the resistivity of the wafer. The decline in resistivity due to the formation of these oxygen donors must be held to 2% or less. The resistivity tolerance allowed in an IGBT substrate varies with the particular product, although a narrow tolerance is about ±7%. Even with the use of neutron irradiation, which is able to most uniformly dope phosphorus, the overall variation, inclusive of the variation between irradiation batches, variation in the axial direction of the ingot and variation within the plane of the wafer, is about ±5%. Therefore, the allowable range for resistivity variation factors other than non-uniformities in the phosphorus concentration, that is, for a decrease in resistivity due to oxygen donors, appears to be about 2%.

(3) The resistivity of single crystal silicon wafers produced by the CZ method can be controlled by the amount of phosphorus (dopant) added to the silicon melt. However, because phosphorus has a small segregation coefficient, the concentration varies widely in the lengthwise direction of the silicon single crystal. Therefore, the range within any one silicon single crystal over which wafers having resistivities that conform with the design specifications is narrow.

(4) Single crystal silicon wafers produced by the CZ method contain an oxygen excess of about $1 \times 10^{18}$ atoms/cm$^3$. When device forming processes are carried out on such wafers, the excess oxygen precipitates out as $SiO_2$, shortening the recombination lifetime.

As a result of extensive investigations conducted in order to resolve above problems (1) to (4), the inventors have discovered that wafers having the properties required for IGBTs can be manufactured using the CZ method.

Accordingly, the invention provides a single crystal silicon wafer for use in the production of insulated gate bipolar transistors (IGBT) which is made of single crystal silicon grown by the Czochralski method and has a gate oxide with a film thickness of from 50 to 150 nm, wherein the wafer has an interstitial oxygen concentration of at most $7.0 \times 10^{17}$ atoms/cm$^3$, a resistivity variation within the plane of the wafer of at most 5% and, letting $t_{ox}$ (cm) be the gate oxide film thickness and S (cm$^2$) be the electrode surface area when determining the TZDB pass ratio, a density d (cm$^{-3}$) of crystal originated particles (COP) having a size at least twice the gate oxide film thickness which satisfies the following formula (1).

$$d \leq -\ln(0.9)/(S \cdot t_{ox}/2) \quad (1)$$

Moreover, the IGBT single crystal silicon wafer of the invention is characterized in that, letting the resistivity be R (Ω·cm), the interstitial oxygen concentration [Oi] (atoms/cm$^3$) has a range which satisfies formula (2) below. The interstitial oxygen concentrations specified in the invention are all values according to ASTM F121-1979.

$$[Oi] \leq 1.482 \times 10^{18} \times R^{-0.2063} \quad (2)$$

In the single crystal silicon wafer which satisfies above formula (2), the percent decrease in resistivity when one hour of heat treatment at 450° C. has been carried out is 2% or less. Moreover, at an interstitial oxygen concentration of $7.0 \times 10^{17}$ atoms/cm$^3$ or less, the density of bulk microdefects (BMD) that arise when two-stage heat treatment, at 800° C. for 4 hours and at 1,000° C. for 16 hours, has been carried out is not more than $5 \times 10^7$ cm$^{-3}$ or less, and the recombination lifetime when such two-stage heat treatment has been carried out is at least 100 microseconds.

In the inventive single crystal silicon wafer for IGBTs, it is preferable for the grown silicon single crystal to have been subjected to neutron irradiation and thereby doped with phosphorus.

It is desirable for the inventive single crystal silicon wafer for IGBTs to include phosphorus and a p-type dopant having a smaller segregation coefficient than phosphorus in respective concentrations of at least $1 \times 10^{13}$ atoms/cm$^3$ but not more than $1 \times 10^{15}$ atoms/cm$^3$.

In the inventive single crystal silicon wafer for IGBTs, it is preferable for the silicon single crystal to be doped with at least $1 \times 10^{13}$ atoms/cm$^3$ but not more than $5 \times 10^{15}$ atoms/cm$^3$ of nitrogen.

In the invention, the resistivity variation is the value obtained by measuring the resistivity at a total of three places—the center of the wafer, a position midway between the center and the edge of the wafer, and the edge of the wafer—then selecting the maximum and minimum values from the resistivities at these three places, and calculating the following:

[(maximum value−minimum value)×100]/minimum value.

TZDB is the abbreviation for "time zero dielectric breakdown," which is one indicator of the GOI. As used herein, "TZDB pass rate" is the probability that electrostatic breakdown did not arise when the current-voltage curve was measured at 229 places over an entire wafer under the following conditions: formation of a gate oxide on the surface of the wafer, formation on the gate oxide of a measurement electrode having an electrode surface area of 8 mm$^2$, and a test current of 1 mA. This pass rate is the C-mode pass rate.

With the single crystal silicon wafer for IGBTs of the invention, because the density of COPs having a size at least twice the gate oxide film thickness is in a range that satisfies formula (1), when the gate oxide is formed at or near the wafer surface in the IGBT manufacturing process, the probability of COPs of a size that would degrade the GOI becoming incorporated in the gate oxide is low. Hence, substantially no GOI degradation occurs, resulting in a GOI yield of 90% or more.

The significance of formula (1) is described below.

The gate oxide on an IGBT has a thickness in a range of 50 to 150 nm, and generally about 100 nm, which is much thicker than the gate oxide on an LSI device such as a memory chip. Let us thus investigate the relationship between the GOI yield (TZDB pass rate) and the size and density of COPs when a gate oxide having a thickness of about 100 nm is formed on a wafer.

A silicon wafer (150 mm diameter, n-type, 46 to 54 Ω·cm) produced by the CZ method was used as the test wafer.

The COP size distribution is measured using an OPP apparatus (manufactured by Accent Optical Technologies) by the method described in JP-A 8-261831. Polygonal oxygen precipitates of varying sizes are examined with the OPP apparatus and a transmission electron microscope, and a signal strength to actual defect size (diameter of equal volume sphere) conversion coefficient is determined, based on which the size distribution of the COPs is measured.

The method used to measure the GOI yield (TZDB pass rate) involves forming 71 nm, 83 nm and 108 nm gate oxides on test wafers and creating 229 MOS capacitors having electrode surface areas of 8 mm², then measuring the current-voltage curves for each of the MOS capacitors at an electrical field strength of 8 MV/cm and a current of 1 mA. The probability that gate oxide breakdown did not occur was treated as the GOI yield (TZDB pass ratio).

Figure 1:
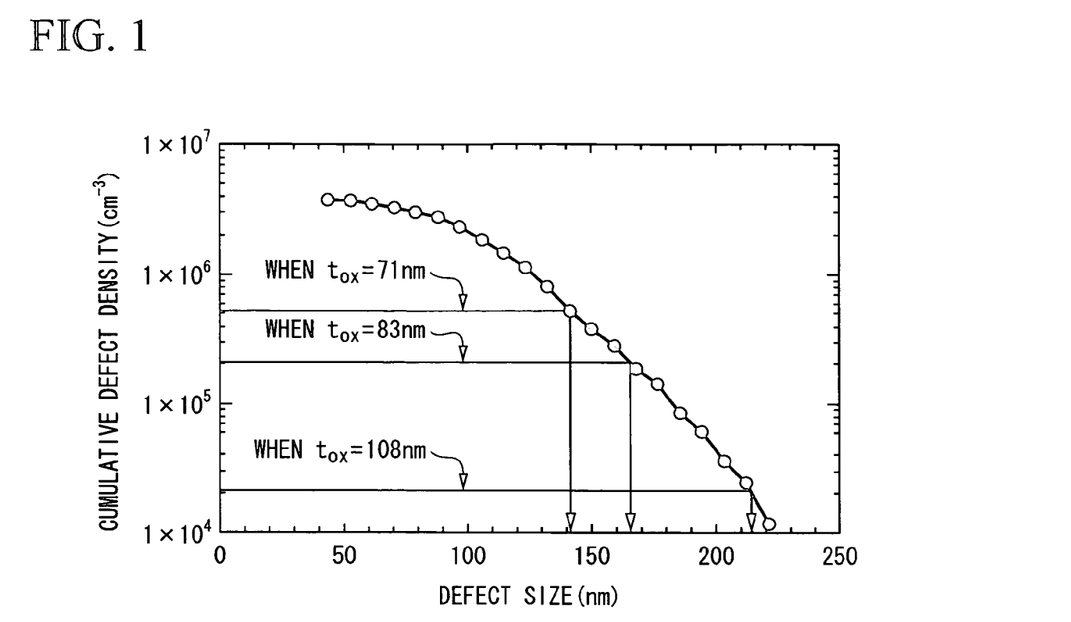
FIG. 1 is a graph of COP size versus cumulative defect density.

FIG. 1 shows the size distribution of COPs on the test wafers, and Table 1 shows the relationship between the gate oxide thickness and the GOI yield.

Table 1 also shows the GOI defect density on the test wafers. The GOI defect density is the density of defects that cause gate oxide breakdown, as determined from the GOI yield using formula (3) below.

$$d = -\ln(Y/100)/(S \cdot t_{ox}/2) \quad (3)$$

Here, d is the GOI defect density (cm⁻³), Y is the GOI yield (%), S is the electrode surface area (cm²) when determining the TZDB pass ratio, and $t_{ox}$ is the gate oxide thickness (nm) when determining the TZDB pass ratio.

TABLE 1

| Gate oxide thickness (nm) | GOI yield (%) | GOI defect density (cm⁻³) | Minimum size of GOI defects (nm) |
|---|---|---|---|
| 71 | 86.0 | $5.3 \times 10^5$ | 140 nm |
| 83 | 93.0 | $2.2 \times 10^5$ | 165 nm |
| 108 | 99.1 | $2.1 \times 10^4$ | 215 nm |

The density of all the COPs detected by the OPP apparatus (cumulative defect density in FIG. 1) is $3.8 \times 10^6$ cm⁻³, but the GOI defect densities shown in Table 1 are lower than this. That is, only some of the COPs detected by the OPP apparatus degrade the GOI. Based on the assumption that, of all the COPs, the COPs of a relatively large size are the ones that degrade the GOI, the minimum size of the GOI defects was determined from FIG. 1 and Table 1. For example, the GOI defect density at a gate oxide thickness of 83 nm is $2.2 \times 10^5$ cm⁻³. In FIG. 1, the defect size at which the cumulative defect density achieves this density is found to be, as shown by the arrow, about 165 nm. In other words, when the gate oxide thickness is 83 nm, COPs having a size of about 165 nm or more are the cause of gate oxide breakdown. Similarly, at a gate oxide thickness of 71 nm, gate oxide breakdown is caused by COPs having a size of about 140 nm or more, and at a gate oxide thickness of 108 nm, gate oxide breakdown is caused by COPs having a size of about 215 nm or more. Here, on examining the relationship between the gate oxide thickness and the minimum size of GOI defects, it is apparent that gate oxide breakdown is caused by COPs at least about twice as large as the gate oxide thickness. Therefore, letting d (cm³) be the density of COPs having a size which is at least twice the gate oxide thickness, it is apparent that to achieve a GOI yield of at least 90%, in above formula (3), Y should be set equal to 90. This is how above formula (1) is derived.

To illustrate, in a case where the gate oxide thickness is 100 nm—which is common in IGBTs—and the electrode surface area at the time of TZDB measurement is 8 mm², by setting the density of defects which are 200 nm or larger to $2.6 \times 10^5$ cm⁻³ or less, the GOI yield becomes at least 90%.

Methods of controlling the size of the COPs include a method in which the amount of vacancies that become incorporated into the gate oxide is controlled by controlling the crystal growth rate and the temperature gradient in the axial direction of the crystal, a method that involves shortening the length of time that crystals reside in the temperature range at which COP growth occurs, and a nitrogen doping method. Of these, nitrogen doping methods are the easiest to carry out and also very effective.

Formula (3) for determining the GOI defect density is derived from Formula 7 in C. M. Osburn and D. W. Ormond: *J. Electrochem. Soc.* 119, 591 (1972). This Formula 7 is shown below as formula (4).

$$-\ln P'(E) = F \int \rho(\zeta) d\zeta \quad (4)$$

Here, the range of integration is $\zeta = 0$ to E.

In formula (4), P'(E) represents the probability that the MOS capacitor will break down in an electric field larger than the electric field strength E; that is, the ratio of non-defective product up to an electric field strength E. F is the electrode surface area (=gate electrode surface area), and p represents the surface area defect density (cm⁻²). The right side of above formula (4) corresponds to the number of defects in the oxide layer of the MOS capacitor.

When the single crystal silicon wafer is thermally oxidized, silicon to a depth of about one-half of the oxide film thickness is consumed by oxide film formation (e.g., when the silicon from the surface to a depth of 50 nm is oxidized, a 100 nm oxide film forms). Therefore, the number of defects that are incorporated in the oxide film of the MOS capacitor is (capacitor electrode surface area)×(oxide film thickness/2)× (volume defect density). Letting the MOS capacitor electrode surface area (gate electrode surface area) be S (cm²), the gate oxide thickness be $t_{ox}$ (cm), the volume defect density be d (cm⁻³), and the non-defective product ratio up to a given electric field strength be Y (%), formula (4) can be expressed as follows.

$$-\ln(Y/100) = S \cdot (t_{ox}/2) \cdot d \quad (5)$$

Dividing both sides of formula (5) by $S \cdot (t_{ox}/2)$, we get formula (3).

From the above, it is apparent that, to ensure that the GOI yield (TZDB pass rate) is 90% or more, the relationship of the density of COPs having a size at least twice the gate oxide thickness with the gate electrode surface area and the gate oxide thickness must satisfy formula (1).

Next, the basis for above formula (2) is discussed.

The temperature at which the donors (thermal donors, sometimes abbreviated below as "TD") which originate from oxygen arise most easily is 450° C. In device forming processes, sintering treatment of the aluminum lines is carried out at about this temperature for approximately 1 hour. In IGBTs having a high resistivity and a narrow resistivity tolerance, it is important to suppress the formation of thermal donors. Hence, the interstitial oxygen concentration dependence of thermal donors that form when one hour of heat treatment at 450° C. is administered was investigated. The results are shown in FIG. 2.

Figure 3:
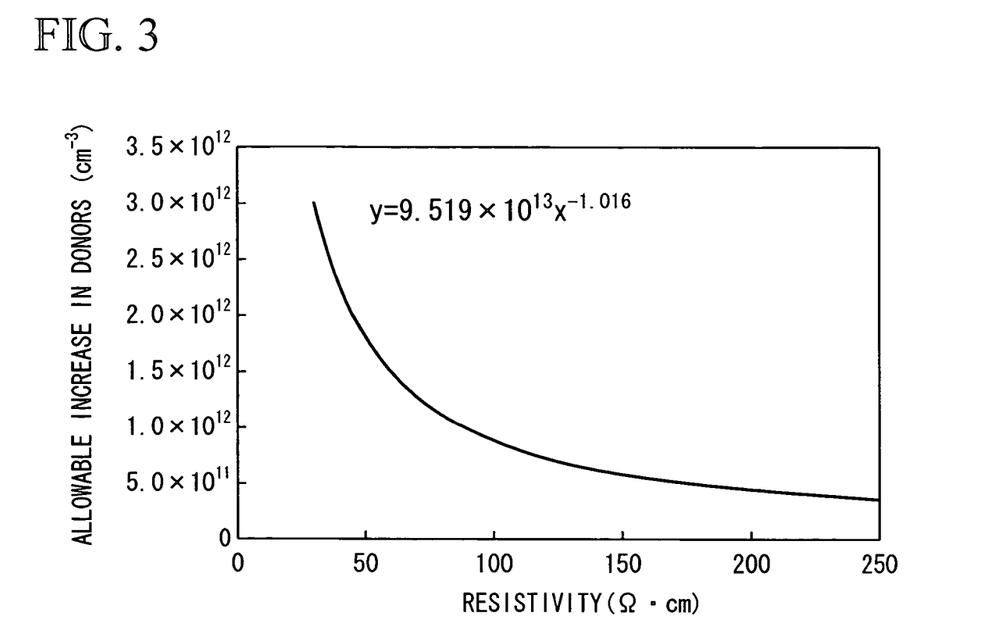
FIG. 3 is a graph of resistivity versus allowable donor concentration.

FIG. 3 shows the resistivity dependence of the allowable increase in donors when the resistivity is allowed to fall up to 2% from a target value.

Figure 2:
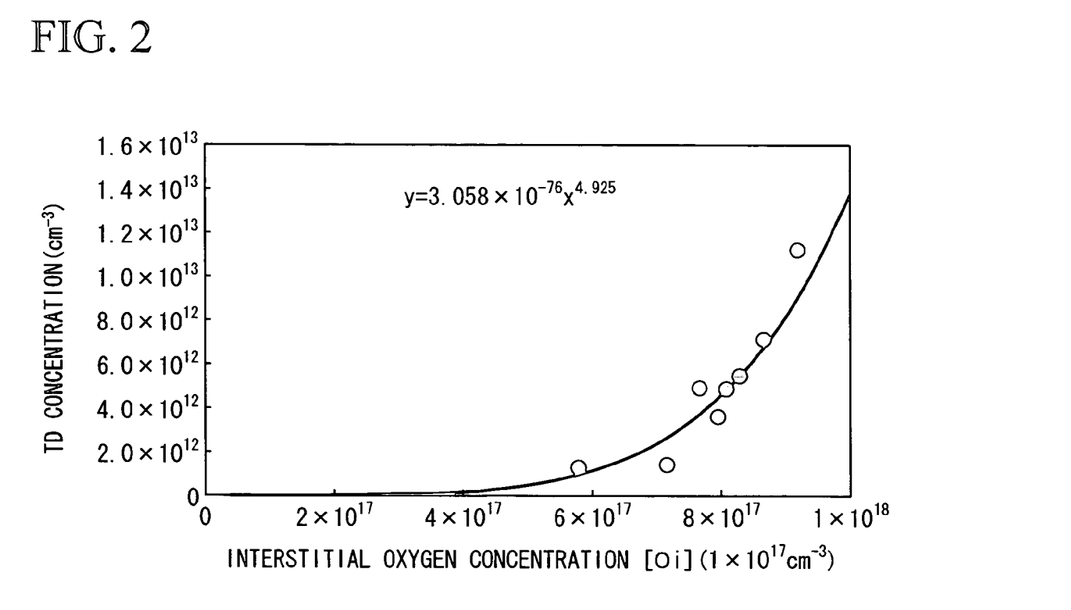
FIG. 2 is a graph of interstitial oxygen concentration versus thermal donor concentration.
Figure 4:
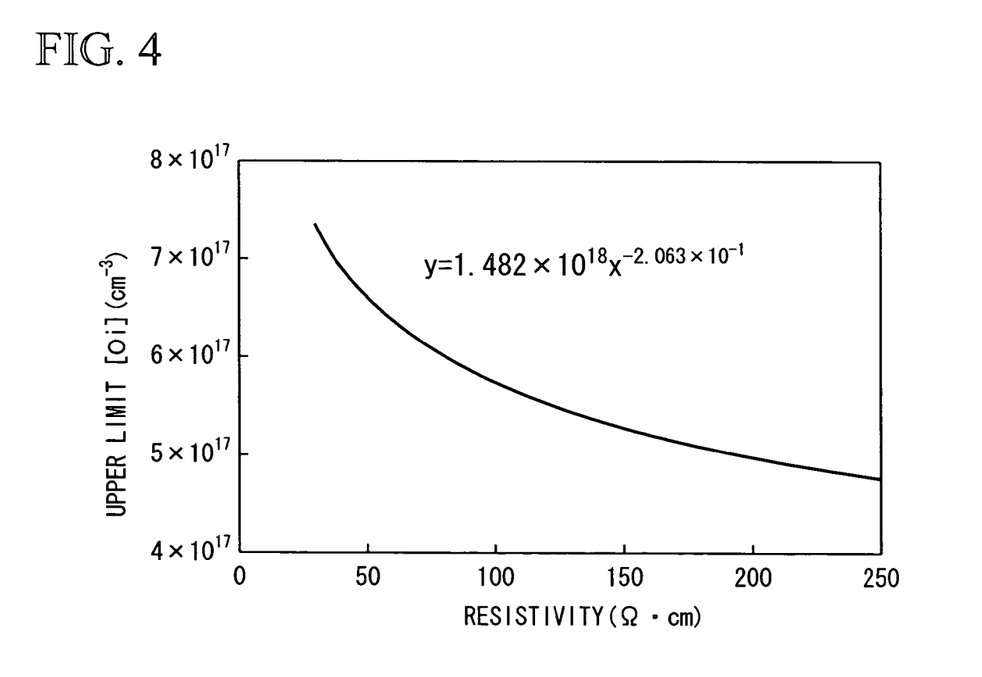
FIG. 4 is a graph of resistivity versus upper limit oxygen concentration.

Based on FIGS. 2 and 3, FIG. 4 shows the upper limit interstitial oxygen concentration when the resistivity is allowed to fall up to 2% with 1 hour of thermal treatment at 450° C.

If the relationship between the resistivity and the interstitial oxygen concentration satisfies formula (2), the drop in resistivity due to 1 hour of thermal treatment at 450° C. can be held to 2% or less. Moreover, at an interstitial oxygen concentration of $7.0 \times 10^{17}$ atoms/cm³ or less, the BMDs that arise when two-stage heat treatment (4 hours at 800° C., and 16 hours at 1,000° C.) is carried out have a density of $5 \times 10^7$ cm$^{-3}$ or less, and the recombination lifetime when such two-stage heat treatment is carried out becomes 100 ms or more. If formula (2) is satisfied and the interstitial oxygen concentration is $7.0 \times 10^{17}$ atoms/cm$^3$ or less, the decreases in resistivity and lifetime due to heat treatment that were drawbacks of CZ crystals can be prevented.

While it is difficult to set the interstitial oxygen concentration to $7.0 \times 10^{17}$ atoms/cm$^3$ or less with a conventional CZ method, an interstitial oxygen concentration of $7.0 \times 10^{17}$ atoms/cm$^3$ or less can be achieved by using a magnetic Czochralski (MCZ) process in which the single crystal is grown under the application of a magnetic field. A decrease in the interstitial oxygen concentration can also be achieved by setting the rotational speed of the quartz crucible rotate to a small value.

The single crystal silicon wafer of the invention has a resistivity variation in the plane of the wafer of 5% or less, enabling stable IGBT qualities to be achieved.

However, although the resistivity of the single crystal silicon wafers produced by the CZ method can be controlled based on the amount of dopant included in the silicon single crystal, because the phosphorus used as a dopant in the IGBT substrate has a small segregation coefficient, the phosphorus concentration varies widely in the lengthwise direction of the silicon single crystal. Hence, the range over which wafers having a resistivity that meets the design specifications can be obtained in any one particular single crystal is narrow. For this reason, as noted above, neutron irradiation, the addition of predetermined amounts of phosphorus and a p-type dopant having a smaller segregation coefficient than phosphorus, and various other means are employed in the present invention. In each of these cases, it is important to grow the single crystal using polycrystalline silicon having a low impurity concentration as the starting material and using a quartz crucible which minimizes the extraction of impurities into the melt. By using these means, the yield of the silicon single crystal can be improved.

With regard to neutron irradiation, when a silicon single crystal is grown without adding dopants for adjusting resistivity to the silicon melt and the resulting non-doped silicon single crystal is irradiated with neutrons, the transformation of $^{30}$Si within the crystal to $^{31}$P is employed to dope the crystal with phosphorus. Because $^{30}$Si is uniformly present within a single crystal at a concentration of about 3%, such neutron irradiation is a technique by which phosphorus can be most uniformly doped in both the radial and axial directions of the crystal.

Figure 5:
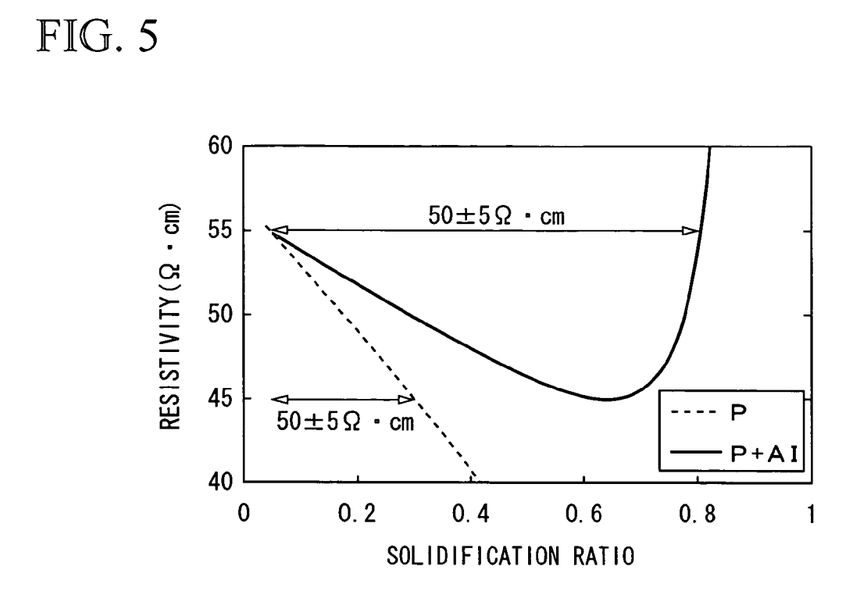
FIG. 5 is a graph of the change in resistivity in the axial direction for a crystal doped only with phosphorus and for a double-doped crystal.

Moreover, even if specific amounts of phosphorus and a p-type dopant having a smaller segregation coefficient than phosphorus are added, resistivity changes in the lengthwise direction of the silicon single crystal can be suppressed. This technique, called "double doping," is disclosed in, for example, JP-A 2002-128591. It is a method for suppressing resistivity changes in the axial direction of a crystal that has been doped with a dopant having a smaller segregation coefficient than phosphorus. Changes in the phosphorus concentration are compensated for by doping with a p-type dopant having a smaller segregation coefficient than phosphorus (e.g., aluminum, gallium, indium) as a counterdopant. FIG. 5 shows the changes in resistivity in the axial direction of the crystal when doped with phosphorus alone and when doped at the same time with both phosphorus and aluminum. When the wafer resistivity specification is 50±5 Ω·cm, by simultaneously doping both phosphorus and aluminum, the yield is improved about three-fold. Setting the aluminum concentration ratio relative to phosphorus at the top end of the single crystal to about 55% provides the largest increase in yield. In the practice of the invention, by including phosphorus and the p-type dopant having a segregation coefficient smaller than phosphorus at respective concentrations of at least $1 \times 10^{13}$ atoms/cm$^3$ but not more than $1 \times 10^{15}$ atoms/cm$^3$, a change in resistivity in the lengthwise direction of the silicon single crystal can be suppressed.

Moreover, in the present invention, use may also be made of the so-called continuous Czochralski (CCZ) method. This method, which is disclosed in, for example, JP-A 61-36197, involves adding polycrystalline silicon and phosphorus to a silicon melt containing phosphorus as an n-type dopant during growth of the single crystal, and thereby keeping substantially constant the concentration of dopant taken up into the single crystal. Moreover, in the present invention, use can also be made of the so-called double layered Czochralski (DLCZ) method. The DLCZ method suppresses changes along the axial direction of the crystal in the concentration of dopants having a small segregation coefficient, such as phosphorus. In this process, which is disclosed in, for example, JP-A 5-43384, first all of the polycrystalline silicon is dissolved in a quartz crucible to form a silicon melt, following which phosphorus is added and the temperature at the bottom of the quartz crucible is lowered so as to allow the silicon melt to solidify from the bottom upward, thereby forming a solidified silicon layer. By growing the crystal while gradually melting this solidified silicon layer from the top down, the dopant concentration taken up into the single crystal is held substantially constant.

In addition, during single crystal growth in which dopant is added to the silicon melt, as in the DLCZ method and the CCZ method, to suppress resistivity variations in the plane of the wafer, it is desirable to rotate the crystal at a high speed during crystal growth. In the growth of single crystals having a diameter of 200 mm or less, the rate of crystal rotation is preferably set to from 15 to 30 rpm. For crystals which are 300 mm or more in diameter, rotation at a speed in a range of from 8 to 15 rpm is preferred.

Next, the size of the COPs is easily reduced by doping the silicon single crystal with at least $1 \times 10^{13}$ atoms/cm$^3$ but not more than $5 \times 10^{15}$ atoms/cm$^3$ of nitrogen. At a nitrogen doping level below this lower limit value, it will be difficult to reduce the size of the COPs, whereas at a nitrogen doping level greater than the upper limit value, nitride forms, making the growth of a silicon single crystal impossible.

With the single crystal silicon wafers of the invention, when 1 hour of heat treatment at 450° C. is carried out, the resistivity decreases by 2% or less. When two-stage heat treatment (4 hours at 800° C., and 16 hours at 1,000° C.) is carried out, the density of BMDs that form is $5 \times 10^7$ cm$^{-3}$ or less and the recombination lifetime is at least 100 ms. As a result, the properties desired of single crystal silicon wafers for IGBT production can be satisfied.

The recombination lifetime degrades due to the precipitation of interstitial oxygen present within the silicon single crystal as $SiO_2$ in the course of the device forming processes. With the inventive wafer, as noted above, because the interstitial oxygen concentration is $7.0 \times 10^{17}$ atoms/cm$^3$ or less, a recombination lifetime of at least 100 ms can be achieved.

Next, the method of manufacturing a single crystal silicon wafer for use in the production of insulated gate bipolar transistors which is made of single crystal silicon grown by the Czochralski method and has a gate oxide with a film thickness of from 50 to 150 nm according to another aspect of the invention includes the steps of pulling a silicon single crystal having a density d of COPs with a size at least twice the gate oxide film thickness calculated by formula (6) below $$d \leq -\ln(0.9)/(S \cdot t_{ox}/2) \quad (6),$$

$t_{ox}$ (cm) being the gate oxide film thickness and S (cm$^2$) the electrode surface area when evaluating the yield of TZDB pass ratio, and having an interstitial oxygen concentration of at most 7×10$^{17}$ atoms/cm$^3$ while applying a magnetic field to the silicon melt to which dopant for adjusting the resistivity has not been added; then subjecting the pulled silicon single crystal to neutron irradiation so as to dope the crystal with phosphorus.

The method of manufacturing a single crystal silicon wafer for use in the production of insulated gate bipolar transistors which is made of single crystal silicon grown by the Czochralski method and has a gate oxide with a film thickness of from 50 to 150 nm according to yet another aspect of the invention includes the step of pulling a silicon single crystal having a density d of COPs with a size at least twice the gate oxide film thickness calculated by formula (7) below $$d \leq -\ln(0.9)/(S \cdot t_{ox}/2) \quad (7),$$

$t_{ox}$ (cm) being the gate oxide film thickness and S (cm$^2$) the electrode surface area when evaluating the yield of TZDB pass ratio, and having an interstitial oxygen concentration of at most 7×10$^{17}$ atoms/cm$^3$ while applying a magnetic field to the silicon melt to which have been added at least 2.9×10$^{13}$ atoms/cm$^3$ but not more than 2.9×10$^{15}$ atoms/cm$^3$ of phosphorus and a p-type dopant having a smaller segregation coefficient than phosphorus so that the concentration of the p-type dopant in the crystal, depending on the segregation coefficient thereof, is at least 1×10$^{13}$ atoms/cm$^3$ but not more than 1×10$^{15}$ atoms/cm$^3$.

The method of manufacturing a single crystal silicon wafer for use in the production of insulated gate bipolar transistors which is made of single crystal silicon grown by the Czochralski method and has a gate oxide with a film thickness of from 50 to 150 nm according to a still further aspect of the invention includes the step of pulling a silicon single crystal from a silicon melt to which has been added an n-type dopant while applying a magnetic field to the melt and adjusting the amount of the silicon melt and the amount of dopant so that the dopant concentration in the silicon melt remains constant, which silicon single crystal has a density d of COPs with a size at least twice the gate oxide film thickness calculated by formula (8) below $$d \leq -\ln(0.9)/(S \cdot t_{ox}/2) \quad (8),$$

$t_{ox}$ (cm) being the gate oxide film thickness and S (cm$^2$) the electrode surface area when evaluating the yield of TZDB pass ratio, and has an interstitial oxygen concentration of at most 7×10$^{17}$ atoms/cm$^3$.

In the inventive methods of manufacturing an IGBT single crystal silicon wafer, it is preferable for nitrogen to be added to the silicon melt in a concentration of at least 1.4×10$^{16}$ atoms/cm$^3$ but not more than 7.1×10$^{18}$ atoms/cm$^3$.

In the inventive method of manufacturing a single crystal silicon wafer for use in the production of insulated gate bipolar transistors which is made of single crystal silicon grown by the Czochralski method and has a gate oxide with a film thickness of from 50 to 150 mm, it is preferable to pull the silicon single crystal from the silicon melt while adding nitrogen to the silicon melt at a concentration of at least 1.4×10$^{16}$ atoms/cm$^3$ but not more than 7.1×10$^{18}$ atoms/cm$^3$, setting the center height of the magnetic field applied to the silicon melt with respect to the liquid surface of the melt in a range of from −150 to +100 mm, and more preferably from −75 to +50 mm, and setting the magnetic field strength at the foregoing center height in a range of from 2,000 to 4,000 G (0.2 to 0.4 T), and more preferably from 2,500 to 3,500 G (0.25 to 0.35 T).

Moreover, in the inventive method of manufacturing an IGBT single crystal silicon wafer, it is preferable for the pulled silicon single crystal to be subjected to neutron irradiation and thereby doped with phosphorus.

Also, in the inventive method of manufacturing an IGBT single crystal silicon wafer, it is preferable to add to the silicon melt both at least 2.9×10$^{13}$ atoms/cm$^3$ but not more than 2.9×10$^{15}$ atoms/cm$^3$ of phosphorus, and also a p-type dopant having a smaller segregation coefficient than phosphorus so that the concentration of the p-type dopant in the crystal, depending on the segregation coefficient thereof, is at least 1×10$^{13}$ atoms/cm$^3$ but not more than 1×10$^{15}$ atoms/cm$^3$.

With the above-described methods of manufacturing IGBT single crystal silicon wafers, it is possible to easily produce wafers having a low interstitial oxygen concentration and a small COP size because nitrogen is introduced into the silicon melt and the single crystal silicon is pulled while applying a magnetic field.

In particular, by applying a magnetic field at the above-indicated magnetic field strength and in the above-indicated magnetic field center height range, convection of the silicon melt can be suppressed, thus enabling the interstitial oxygen concentration to be reduced.

Also, by either subjecting the non-doped silicon single crystal after pulling to neutron irradiation and thereby doping it with phosphorus, or by pulling the single crystal silicon from a silicon melt to which phosphorus and a p-type dopant having a smaller segregation coefficient than phosphorus have been added, resistivity changes in the lengthwise direction of the silicon single crystal can be reduced.

The present invention thus provides IGBT single crystal silicon wafer manufacturing methods which increase the production yield and can produce wafers having a small resistivity variation, and also provides such IGBT single crystal silicon wafers.

PREFERRED EMBODIMENTS

Embodiments of the invention are described below while referring to the accompanying diagrams.

Construction of CZ Furnace

Figure 6:
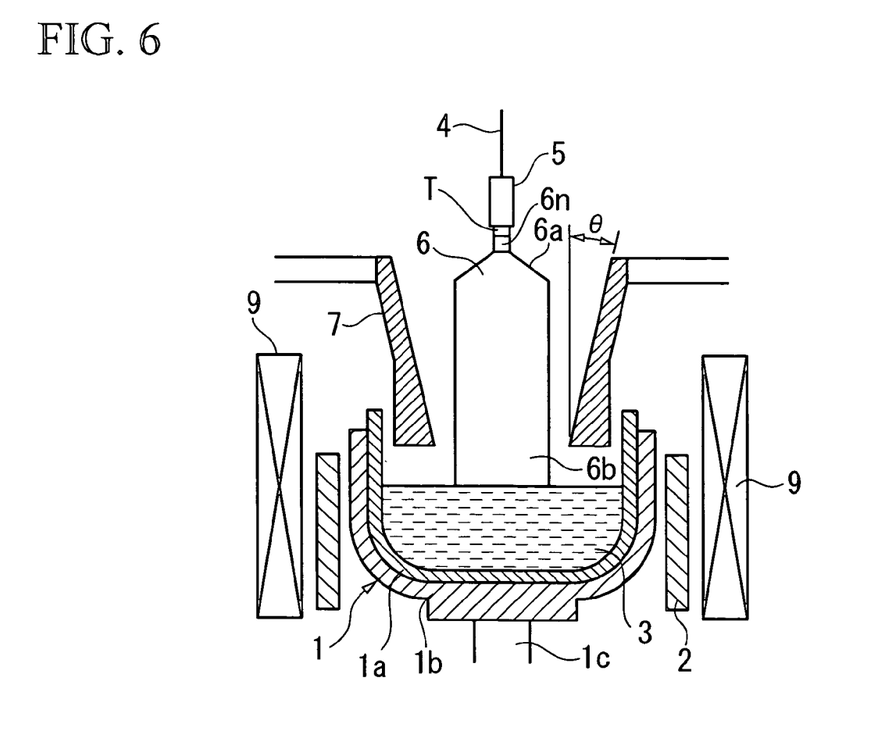
FIG. 6 is a schematic vertical sectional view of the CZ furnace used when working the method of manufacturing single crystal silicon wafers according to an embodiment of the invention.

FIG. 6 is a schematic vertical sectional view of a CZ furnace such as may be used for working the method of manufacturing IGBT single crystal silicon wafers according to the present embodiments of the invention.

The CZ furnace shown in FIG. 6 has a crucible 1 which is centrally located within a chamber, a heater 2 disposed outside of the crucible 1, and a magnetic field generator 9 disposed outside of the heater 2. The crucible 1 has a double construction composed of an inner quartz crucible 1a which holds therein a silicon melt 3 and is itself held within an outer graphite crucible 1b. The crucible 1 is rotated and vertically driven by a supporting shaft 1c commonly referred to as a pedestal.

A cylindrical heat shield 7 is provided above the crucible 1. The heat shield 7 is composed of an outer graphite shell filled on the inside with a graphite felt. The heat shield 7 has an inner face which is tapered so that the inside radius gradually decreases from the top edge to the bottom edge. The outer face at the top of the heat shield 7 is tapered to match the inner face and the outer face at the bottom is formed as a substantially straight face, so that the thickness of the heat shield 7 gradually increases in the downward direction.

A seed crystal T mounted on a seed chuck 5 is dipped in the silicon melt 3, then pulled upward while the crucible 1 and the pull shaft 4 are rotated, enabling the formation of a silicon single crystal 6.

The heat shield 7, which blocks heat radiation from the heater 2 and the surface of the silicon melt 3 to the lateral surface of the silicon single crystal 6, surrounds the lateral surface of the silicon single crystal 6 being grown and also surrounds the surface of the silicon melt 3. Exemplary specifications for the heat shield 7 are as follows. For instance, the heat shield 7 may have a width (thickness) W in the radial direction of 50 mm, an inner face shaped as an inverted cone with an inclination θ to the vertical of 21°, and a bottom end height H1 above the surface of the melt of 60 mm.

The strength of the magnetic field applied by the magnetic field generator 9 will vary depending on whether, for example, a horizontal magnetic field or a cusp magnetic field is used. When a horizontal magnetic field is applied, the magnetic field strength is set within a range of 0.2 to 0.4 T, and preferably 0.25 to 0.35 T, and the center height of the magnetic field relative to the liquid surface of the silicon melt is set within a range of −150 to +100 mm, and preferably −75 to +50 mm.

By using the magnetic field generator 9 to supply a magnetic field having a strength and a center height in the above-indicated ranges, it is possible to suppress convection and to reduce the interstitial oxygen concentration of the silicon single crystal.

Method of Manufacturing IGBT Single Crystal Silicon Wafers

Next, a method of manufacturing IGBT single crystal silicon wafers using the CZ furnace shown in FIG. 6 is described.

First, the crucible 1 is charged with, e.g., 37.5 kg of high-purity polycrystalline silicon and, for example, a silicon wafer having a CVD film composed of silicon nitride is added as the nitrogen source. It is preferable to adjust the amount of the nitrogen source added so that at least $1.4 \times 10^{16}$ atoms/cm$^3$ but not more than $7.1 \times 10^{18}$ atoms/cm$^3$ of nitrogen is introduced into the silicon melt.

The interior of the CZ furnace is then placed under an inert gas atmosphere, and the ambient pressure within the furnace is set to from 1.3 to 13.3 kPa (10 to 100 torr).

Next, a horizontal magnetic field of 0.35 T, for example, is applied by the magnetic field generator 9 at a magnetic field center height positioned 50 mm to the silicon melt side from the solid-liquid interface between the silicon single crystal and the silicon melt. At the same time, the polycrystalline silicon is heated by a heater 2, turning it into a silicon melt 3.

It should be noted that these magnetic field application conditions are given here only for illustrative purposes, and are not limitative of the invention.

A seed crystal T mounted on a seed chuck 5 is then dipped in the silicon melt 3, and crystal pulling is carried out while rotating the crucible 1 and the pull shaft 4. The pulling conditions at this time are exemplified by the following conditions: letting the single crystal growth rate be V (mm/min) and the temperature gradient from the melting point at the time of single crystal growth to 1350° C. be G (° C./mm), the ratio V/G is controlled to from about 0.2 to about 0.3 and V is controlled to from 0.8 to 1.3 mm/min. Other conditions that may be mentioned include setting the speed of rotation by the quartz crucible 1a to from 0.05 to 10 rpm, setting the speed of rotation by the single crystal to from 10 to 20 rpm, setting the pressure of the argon atmosphere to 30 Torr, and setting the magnetic field strength to 0.35 T. In particular, by setting the speed of rotation by the quartz crucible 1a to 1.5 rpm or less, oxygen atoms present in the quartz crucible 1a can be prevented from diffusing into the silicon melt, making it possible to lower the interstitial oxygen concentration in the silicon single crystal. Also, by setting the speed of rotation by the single crystal to 15 rpm or more, the resistivity variation at the interior of the silicon single crystal can be reduced.

By employing the above pulling conditions, the interstitial oxygen concentration in the silicon single crystal can be lowered, thus making it possible to suppress a decline in resistivity due to the formation of oxygen donors in the IGBT manufacturing process. An interstitial oxygen concentration greater than $7.0 \times 10^{17}$ atoms/cm$^3$ is undesirable because oxygen precipitation occurs in the IGBT manufacturing process, lowering the recombination lifetime.

Next, the resulting single crystal silicon to which dopant has not been added is irradiated with a neutron beam so as to adjust the resistivity. This neutron beam irradiation transforms some of the silicon atoms to phosphorus, thereby enabling the single crystal silicon to be uniformly doped with phosphorus, as a result of which single crystal silicon having a uniform resistivity can be obtained. The neutron beam irradiation conditions may be set to, for example, about 80 hours of irradiation at a position where the neutron beam flux is $3.0 \times 10^{12}$ neutrons/cm$^{-2}$/s$^{-1}$ and a crystal rotational speed of about 2 rpm. A silicon ingot irradiated with a neutron beam in this way will have a resistivity of about 48 Ω·cm to about 52 Ω·cm.

Alternatively, instead of neutron beam irradiation, n-type dopants (e.g., phosphorus, arsenic, antimony) may be added beforehand to the silicon melt, although the resistivity will vary considerably in the lengthwise direction of the silicon single crystal owing to the small segregation coefficient. To reduce the change in resistivity associated with changes in the concentration of such n-type dopants, use may be made of the above-mentioned DLCZ method, the double doping method or the CCZ method.

Next, wafers are cut from the silicon crystal silicon, then are lapped, etched and otherwise treated as needed, following which they are optionally subjected to rapid thermal annealing (RTA) heat treatment.

Figure 7:
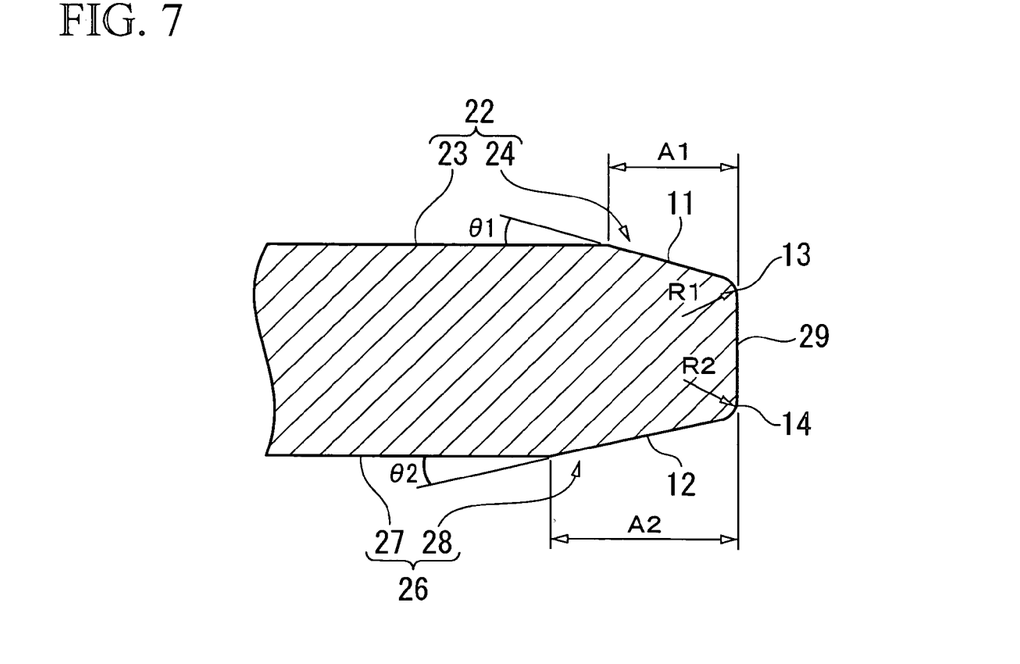
FIG. 7 is a schematic sectional view showing the peripheral edge of a single crystal silicon wafer according to an embodiment of the invention.

To prevent cracking of the wafer when lapping is carried out, it is preferable to form a beveled portion at the edge of the wafer on the topside thereof and also to form a beveled portion at the edge of the wafer on the backside thereof. Moreover, it is desirable to edge grind the beveled portions at the top and back sides of the wafer after the lapping operation so as to finish the wafer to a predetermined shape. FIG. 7 shows a cross section of the wafer edge following the completion of wafer processing.

As shown in FIG. 7, the topside 22 of the wafer is provided with a main face 23 which is a flat plane, and a topside beveled portion 24 formed on the edge of the wafer. The backside 26 is provided with a main face 27 which is a flat plane, and a backside beveled portion 28 formed on the edge of the wafer. The topside beveled portion 24 has a width A1 in the radial direction of the wafer facing inward from the wafer edge 29 which is narrower than the width A2 of the backside beveled portion 28 in the radial direction of the wafer facing inward from the wafer edge 29. The width A1 of the topside beveled portion 24 is preferably in a range of 50 to 200 µm, and the width A2 of the backside beveled portion 28 is preferably in a range of 200 to 300 µm.

The topside beveled portion 24 has a first inclined plane 11 which is inclined to the main face 23 of the topside 22, and the backside beveled portion 28 has a second beveled plane 12 which is inclined to the main face 27 of the backside 26. The first inclined plane 11 has an angle of inclination θ1 which is preferably in a range of 10° to 50°, and the second inclined plane 12 has an angle of inclination θ2 which is preferably in a range of 10° to 30°. Moreover, it is preferable for θ1≦θ2.

A first curved surface 13 is provided so as to connect between the first inclined plane 11 and the wafer edge 29. In addition, a second curved surface 14 is provided so as to connect between the second inclined plane 12 and the wafer edge 29. The radius of curvature R1 for the first curved plane 13 is preferably in a range of 80 to 250 µm, and the radius of curvature R2 for the second curved plane 14 is preferably in a range of 100 to 300 µm.

Next, a polysilicon layer is formed on one side of the wafer. Because the single crystal silicon wafer of the present embodiment has a very low interstitial oxygen concentration, a gettering effect due to oxygen precipitates is unlikely. Hence, by forming a polysilicon layer as a gettering layer on the backside, heavy metal contamination in the IGBT manufacturing steps can be eliminated. Also, forming a polysilicon layer on the backside prevents defects such as slips from occurring, thus making it possible to avoid the propagation of slips to the topside of the wafer. The thickness of the polysilicon layer is preferably at least 50 nm but not more than 2,000 nm. Setting the thickness to at least 50 nm enables a gettering effect and a slip formation inhibiting effect to be fully exhibited, and setting the thickness to no more than 2,000 nm enables warpage of the wafer to be prevented.

In this way, IGBT single crystal silicon wafers according to the present embodiment can be obtained.

IGBT Single Crystal Silicon Wafer

The single crystal silicon wafer manufactured as described above can be advantageously used in the production of IGBTs having a gate oxide film with a thickness of 50 to 150 nm. The wafer has an interstitial oxygen concentration of not more than $7.0 \times 10^{17}$ atoms/cm$^3$, a resistivity variation in the plane of the wafer of not more than 5%, and a TZDB pass rate at an electrical field strength of 8 MV/cm of at least 90%.

Letting the thickness of the gate oxide when evaluating the TZDB pass rate be $t_{ox}$ (cm), and letting the electrode surface area when evaluating the TZDB pass rate be S (cm$^2$), the density d (cm$^{-3}$) of COPs having a size at least twice the gate oxide thickness is in a range that satisfies above formula (1).

The resistivity itself is about 30 to 250 Ω·cm. The single crystal silicon wafer is doped with at least $1 \times 10^3$ atoms/cm$^3$ but not more than $5 \times 10^{15}$ atoms/cm$^3$.

In the IGBT single crystal silicon wafers of the present embodiment, because the resistivity and the interstitial oxygen concentration lie in ranges that satisfy above formula (2), when sintering heat treatment is carried out for approximately one hour at about 450° C. in the manufacture of IGBTs, the decrease in resistivity can be held to 2% or less. Also, by setting the oxygen concentration to $7 \times 10^{17}$ atoms/cm$^{-3}$ or less, the density of BMDs that form on carrying out two-stage heating treatment (4 hours at 800° C. and 16 hours at 1,000° C.) is $5 \times 10^7$ cm$^{-3}$ or less and the recombination lifetime on carrying out such two-stage heating treatment is at least 100 ms.

In the single crystal silicon wafers of the present embodiment, a polysilicon layer with a thickness of at least 50 nm but not more than 2,000 nm is formed on the backside, a topside beveled portion is formed at the edge of the wafer on the topside thereof, and a backside beveled portion is formed at the edge of the wafer on the backside thereof.

Because the IGBT single crystal silicon wafers of the present embodiment have a density of COPs with a size at least twice the gate oxide thickness which satisfies the range indicated by above formula (1), during formation of the gate oxide at or near the surface of the wafer in the IGBT production process, the probability that COPs of a size which degrade the GOI will be incorporated into the gate oxide is low, as a result of which substantially no degradation of the GOI occurs.

This single crystal silicon wafer is used in the production of IGBTs having a gate oxide with a relatively large thickness of from 50 to 150 nm. By stipulating that the density of COPs having a size at least twice the gate oxide thickness on the wafers used in such an application be as indicated by formula (1), a TZDB pass rate of 90% or more can always be achieved.

EXAMPLES

Example 1

Single Crystal Silicon Wafers

Silicon ingots having various interstitial oxygen concentrations were produced by the CZ method. Production was carried out by charging a synthetic quartz crucible with 37.5 kg of polysilicon, adding a silicon nitride CVD film-bearing silicon wafer so as to bring the nitrogen concentration in the silicon melt to $2.63 \times 10^{17}$ atoms/cm$^3$, and melting the polysilicon in an argon atmosphere to form a silicon melt.

Next, a seed crystal was dipped in the silicon melt while applying in a horizontal direction a 0.35 T magnetic field so that the magnetic field center height was positioned 50 mm to the silicon melt side from the liquid surface of the melt, following which the seed crystal was gradually pulled upward while the seed crystal and the synthetic quartz crucible were rotated, thereby growing a single crystal below the seed crystal. Crystal growth was carried out under the following conditions: crucible rate of rotation, 0.05 rpm; crystal rate of rotation, 8 rpm; letting the growth rate of the single crystal be V (mm·min$^{-1}$) and the temperature gradient G from the melting temperature during single crystal growth to 1350° C. be G (K·mm$^{-1}$), a ratio V/G of 0.23 (mm$^2$min$^{-1}$K$^{-1}$); period of time during which the crystal resides at 1200° C. to 1000° C., 33 minutes. As for the size of the grown silicon single crystal, the body portion had a diameter of about 156 mm and a length of about 670 mm.

The resulting silicon single crystal was cut at positions 100 mm and 200 mm from the shoulder to form an ingot. The interstitial oxygen concentration was measured at both ends of the ingot, and found to be in a range of $3.5 \times 10^{17}$ atoms/cm$^3$ to $3.1 \times 10^{17}$ atoms/cm$^3$. The resistivity was from 29,300 to 31,500 Ω·cm, and the conductivity type was n-type.

The ingot was placed in a heavy water reactor and subjected to neutron irradiation at a position in the reactor where the neutron beam flux was $3.0 \times 10^{12}$ neutrons/cm$^2$·s, and at a rotational speed of about 2 rpm for a rotating time of about 80 hours. Following irradiation, samples for measuring resistivity were cut from both ends of the ingot and radiation damage recovery annealing was administered at 900° C. for 30 minutes, following which the resistivity was measured by the four-point probe test. The results are shown in Table 2. Even when the changes in the ingot lengthwise direction were added to the in-plane changes, the resistivity fell within a range of 3.4% ((51.2−49.5)/49.5×100). Hence, greater uniformity of the resistivity in the lengthwise and radial directions of the ingot was achieved.

TABLE 2

| | Resistivity (Ω · cm) | | | |
|---|---|---|---|---|
| | Center | Intermediate position between center and edge | Position 5 mm from edge | RRG |
| Top side | 50.7 | 50.1 | 49.5 | 2.4 |
| Tail side | 51.2 | 50.6 | 50.1 | 2.2 |

Resistivity variation for this ingot: (51.2 − 49.5)/49.5 × 100 = 3.4%
RRG: radial resistivity variation Wafers were then cut from the above ingot and radiation damage recovery annealing was administered, following which the wafers were mirror polished to a thickness of 625 μm and used to evaluate various qualities.

Comparative Example 1

Single Crystal Silicon Wafers

A synthetic quartz crucible was charged with 37.5 kg of polycrystalline silicon, phosphorus was added to a concentration within the silicon melt of $2.1 \times 10^{14}$ atoms/cm$^3$, and the polysilicon was melted in an argon atmosphere to form a silicon melt. Next, a seed crystal was dipped in the silicon melt, after which the seed crystal was gradually pulled upward while the seed crystal and the synthetic quartz crucible were rotated, thereby growing a single crystal below the seed crystal. Crystal growth was carried out under the following conditions: crucible rate of rotation, 7 rpm; crystal rate of rotation, rpm; letting the growth rate of the single crystal be V (mm·min$^{-1}$) and the temperature gradient G from the melting temperature during single crystal growth to 1350° C. be G (K·mm$^{-1}$), a ratio V/G of 0.24 (mm$^2$min$^{-1}$K$^{-1}$); period of time during which the crystal resides at 1200° C. to 1000° C., 147 minutes. As for the size of the grown silicon single crystal, the body portion had a diameter of about 156 mm and a length of about 670 mm.

The resulting silicon single crystal was cut at positions 100 mm and 200 mm from the shoulder to form an ingot. Samples for measuring oxygen concentration and resistivity were cut from both ends of the ingot, and subjected to oxygen donor annihilation annealing at 900° C. for 30 minutes. The oxygen concentration measured by Fourier transform infrared spectroscopy (FT-IR) was from $12.1 \times 10^{17}$ atoms/cm$^3$ to $13.5 \times 10^{17}$ atoms/cm$^3$. Next, the resistivity was measured by the four-point probe test. Those results are shown in Table 3. Adding changes in the ingot lengthwise direction to in-plane changes, the variation in resistivity was 18.7% ((56.5−47.6/47.6×100). Compared with Example 1, the resistivity variation was thus large.

TABLE 3

| | Center | Intermediate position between center and edge | Position 5 mm from edge | RRG |
|---|---|---|---|---|
| Top side | 52.4 | 53.5 | 56.5 | 7.8 |
| Tail side | 47.6 | 48.9 | 51.2 | 7.6 |

Resistivity variation for this ingot: (56.5 − 47.6)/47.6 × 100 = 18.7%
RRG: radial resistivity variation Next, as in Example 1, wafers were cut from the above ingot and oxygen donor annihilation annealing was administered, following which the wafers were mirror polished to a thickness of 625 μm and used to evaluate various qualities.

Evaluation of Various Properties

COP Size

First, the COP size distribution was evaluated for the wafers obtained in Example 1 and Comparative Example 1. The COP size distribution was measured using an OPP apparatus manufactured by Accent Optical Technologies by the method described in JP-A 8-261831. Polygonal oxygen precipitates of varying sizes were examined with the OPP apparatus and a transition electron microscope, and signal strength to actual defect size (diameter of sphere of equivalent volume) conversion coefficients were determined, based on which the COP size distribution was measured. The results are shown in FIG. 8.

Figure 8:
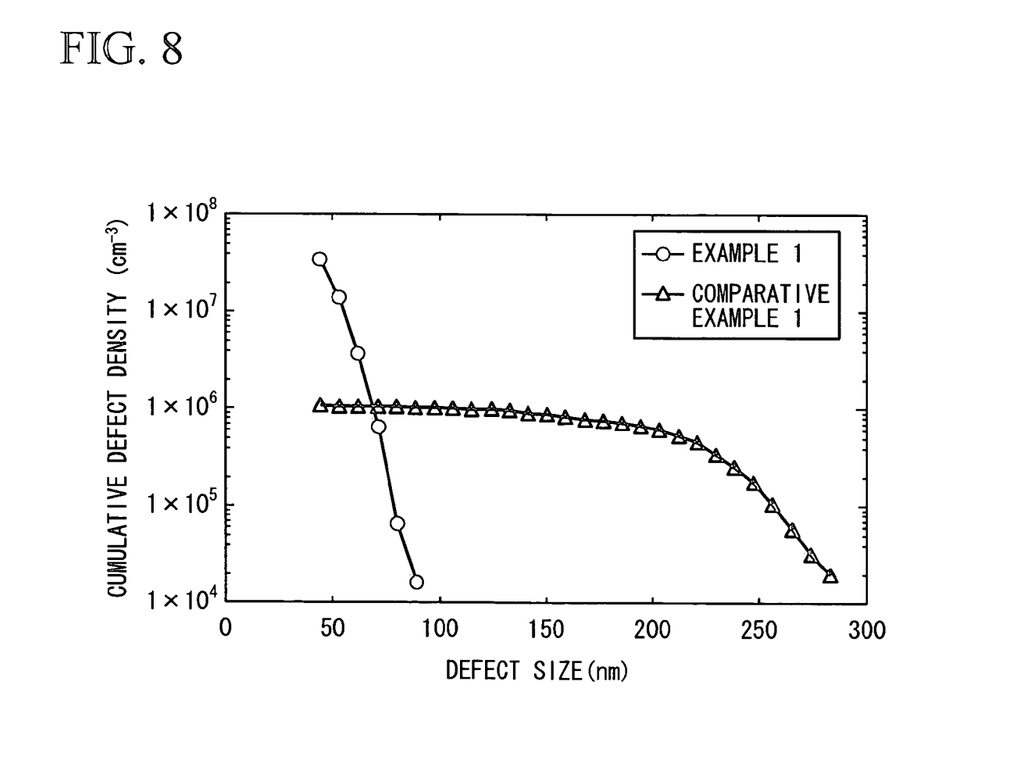
FIG. 8 is a graph of COP size versus cumulative defect density in Example 1 of the invention and Comparative Example 1.

As shown in FIG. 8, the COP size in Example 1 was very small and was confirmed to be under control. The COP size in Comparative Example 1 was found to be larger than that in Example 1.

GOI Yield (TZDB Pass Ratio)

Next, the GOI yield (TZDB pass ratio) was evaluated. The wafers obtained in Example 1 and Comparative Example 1 were subjected to 160 minutes of thermal oxidation in an oxygen atmosphere at 1,000° C. to form a 100 nm gate oxide film, thereby fabricating MOS capacitors for evaluating the gate oxide integrity. The GOI yield obtained on testing at an electrode surface area of 8 mm$^2$, an electric field strength of 8 MV/cm and a current of 1 mA was 100% for Example 1 and 78.6% for Comparative Example 1.

The GOI yield was thus found to be higher in Example 1 than in Comparative Example 1.

Oxygen Donors

Next, the concentration of oxygen donors was measured for the wafers obtained in Example 1 and Comparative Example 1. In anticipation of sintering treatment of the aluminum lines, the change in resistivity before and after carrying out one hour of heat treatment at 450° C. was evaluated by the four-point probe test. In Example 1, the resistivity before heat treatment was 51.1 Ω·cm, and the resistivity after heat treatment was 50.5 Ω·cm. Because there is little change in resistivity before and after heat treatment, it was confirmed that substantially no change in resistivity originates from oxygen donors.

In Comparative Example 1, the resistivity before heat treatment was 48.1 Ω·cm, but the resistivity after heat treatment fell to 21.2 Ω·cm due to the influence of oxygen donor formation.

BMD Suppressing Effect and Recombination Lifetime

Next, to confirm the BMD suppressing effect, the defect densities observed with an OPP apparatus before and after carrying out two-stage heat treatment (4 hours at 800° C. and 16 hours at 1,000° C.) were compared. As a result, in Example 1, the defect density before heat treatment was $3.4 \times 10^7$ cm$^{-3}$ and the defect density after heat treatment was $3.6 \times 10^7$ cm$^{-3}$. Hence, in Example 1, even when heat treatment was carried out, there was substantially no increase in the defect density.

That is, the generation of oxygen precipitates (BMD) was confirmed to be suppressed. These results appeared to indicate that, even when heat treatment was carried out for the purpose of assessment, a decrease in the recombination lifetime did not arise. That is, the recombination lifetime was found to be 2,150 ms before heat treatment and 2,210 ms after heat treatment.

The defect density for Comparative Example 1 was measured with an OPP apparatus in the same way as in Example 1, and was found to be $1.1 \times 10^6$ cm$^{-3}$ before heat treatment and $3.6 \times 10^9$ cm$^{-3}$ after heat treatment. These results mean that BMDs arose when heat treatment was administered in Comparative Example 1. The recombination lifetime in Comparative Example 1 was found to be 1,950 ms before heat treatment. Following heat treatment, the recombination lifetime decreased dramatically to 10 ms.

What is claimed is:

1. A single crystal silicon wafer for use in the production of insulated gate bipolar transistors (IGBT) which is made of single crystal silicon grown by the Czochralski method and has a gate oxide with a film thickness of from 50 to 150 nm, wherein the wafer has an interstitial oxygen concentration of at most $7.0 \times 10^{17}$ atoms/cm$^3$, a resistivity variation within the plane of the wafer of at most 5% and, letting $t_{ox}$ (cm) be the gate oxide film thickness and S (cm$^2$) be the electrode surface area when determining the TZDB pass ratio, a density d (cm$^{-3}$) of crystal originated particles (COP) having a size at least twice the gate oxide film thickness which satisfies the following formula (1):

$$d \leq -\ln(0.9)/(S \cdot t_{ox}/2) \tag{1}$$

2. The single crystal silicon wafer for IGBT as set forth in claim 1, wherein letting the resistivity be R ($\Omega \cdot$cm), the interstitial oxygen concentration [Oi] (atoms/cm$^3$) has a range which satisfies formula (2) below:

$$[Oi] \leq 1.482 \times 10^{18} \times R^{-0.2063} \tag{2}$$

3. The single crystal silicon wafer for IGBT as set forth in claim 1, wherein the grown silicon single crystal has been subjected to neutron irradiation and thereby doped with phosphorus.

4. The single crystal silicon wafer for IGBT as set forth in claim 1, which includes phosphorus and a p-type dopant having a smaller segregation coefficient than phosphorus in respective concentrations of at least $1 \times 10^{13}$ atoms/cm$^3$ but not more than $1 \times 10^{15}$ atoms/cm$^3$.

5. The single crystal silicon wafer for IGBT as set forth in any one of claims 1 to 4, wherein the silicon single crystal is doped with at least $1 \times 10^{13}$ atoms/cm$^3$ but not more than $5 \times 10^{15}$ atoms/cm$^3$ of nitrogen.

\* \* \* \* \*